(12) United States Patent
Ito et al.

(10) Patent No.: US 7,602,051 B2
(45) Date of Patent: Oct. 13, 2009

(54) THERMALLY CONDUCTIVE RESIN SHEET AND POWER MODULE USING THE SAME

(75) Inventors: Hiromi Ito, Tokyo (JP); Osamu Yashiro, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 448 days.

(21) Appl. No.: 11/408,025

(22) Filed: Apr. 21, 2006

(65) Prior Publication Data

US 2006/0188727 A1 Aug. 24, 2006

(51) Int. Cl.
*H01L 23/495* (2006.01)
(52) U.S. Cl. .................. 257/666; 428/209
(58) Field of Classification Search ........... 428/209, 428/323, 413; 257/666
See application file for complete search history.

(56) References Cited

U.S. PATENT DOCUMENTS 5,834,101 A * 11/1998 Hayashi .............. 428/209

FOREIGN PATENT DOCUMENTS

| JP | 3-200397 | 9/1991 |
|---|---|---|
| JP | 2001-196495 | 7/2001 |
| JP | 2002-030223 | 1/2002 |
| JP | 2002-121393 | 4/2002 |
| JP | 2002-155110 | 5/2002 |
| JP | 2002-167560 | 6/2002 |
| JP | 2003-133514 | 5/2003 |
| JP | 2003-238657 | 8/2003 |

* cited by examiner

*Primary Examiner*—Thien F Tran
(74) *Attorney, Agent, or Firm*—Leydig, Voit & Mayer, Ltd.

(57) ABSTRACT

A thermally conductive resin sheet includes a thermosetting resin, and a thermally conductive and electrically insulating inorganic filler. The inorganic filler is a mixture of a flat inorganic filler and a granular inorganic filler. The ratio of the volume content, $V_L$, of the flat inorganic filler to volume content, $V_R$, of the granular inorganic filler in the mixture is from 30/70 to 80/20, in terms of $V_L/V_R$.

6 Claims, 6 Drawing Sheets

● : RELATIONSHIP OF $V_L$ WITH $K_M/K_R$
▲ : RELATIONSHIP OF $V_L$ WITH $K_M/K_L$

FIG. 9

THERMALLY CONDUCTIVE RESIN SHEET AND POWER MODULE USING THE SAME

BACKGROUND OF THE INVENTION

1. Field of the Invention

The present invention relates to a thermally conductive resin sheet which is used for conducting heat from a heat generating part into a heat dissipating member in electric or electronic appliances or the like. In particular, the invention relates to an insulating thermally conductive resin sheet which conducts heat of a power module into a heat dissipating member and to a power module using this thermally conductive resin sheet.

2. Description of the Related Art

In thermally conductive resin film layers for conducting heat from a heat generating part into a heat dissipating member in an electric or electronic appliance, there have hitherto been widely used thermally conductive resin compositions having an inorganic filler added to a thermosetting resin in view of requirements of high thermal conductivity and insulation properties.

For example, in a power module, there is a sheet or coating film made of a thermosetting resin containing an inorganic powder as a thermally conductive insulating layer to be provided between the back surface of a lead frame having a power semiconductor device mounted thereon and a metal plate which becomes a heat dissipating part (see, for example, JP-A-2001-196495, page 3 and FIG. 1).

Also, for example, there is a sheet made of a thermosetting resin composition having a highly thermally conductive inorganic filler blended therein as a thermally conductive resin composition which is mediated between a heat generating electronic part such as CPU and a heat dissipating fin (see, for example, JP-A-2002-167560 (page 3 and FIG. 1)).

Following miniaturization of electronic appliances or enhancement in the performance of electronic parts, the amount of heat generation from electronic appliances or electronic parts greatly increases, and thermally conductive resin sheets for conducting heat from a heat generating part to a heat dissipating part in the electric or electronic appliance are required to have higher thermal conductivity.

In conventional insulating thermally conductive resin sheets in which a highly thermally conductive inorganic filler is added to a thermosetting resin, the thermal conductivity is improved by increasing the content of the inorganic filler to be added. However, an increase of the content of the inorganic filler is limited from the standpoint of the production of thermally conductive resin sheets. In addition, there was involved such a problem that it is impossible to obtain an insulating thermally conductive resin sheet having a larger coefficient of thermal conductivity.

Also, in power modules in which the foregoing conventional insulating thermally conductive resin sheet is provided between the heat generating part having a power semiconductor device mounted thereon and a heat sink as a heat dissipating part, there was encountered such a problem that the miniaturization and enhancement in the capacity are limited.

SUMMARY OF THE INVENTION

The invention obtains not only an insulating thermally conductive resin sheet including a thermosetting resin having an inorganic filler added thereto, the thermal conductivity of which is further improved, but also a high-performance power module using this thermally conductive resin sheet having improved thermal conductivity.

According to an aspect of the present embodiment, a thermally conductive resin sheet includes a thermosetting resin, and a thermally conductive and insulating inorganic filler. The inorganic filler is a mixed filler of a flat inorganic filler and a granular inorganic filler. A ratio of a volume content $V_L$ of the flat inorganic filler to a volume content $V_R$ of the granular inorganic filler in the mixed filler is from 30/70 to 80/20 in terms of $V_L/V_R$.

According to another aspect of the present embodiment, a power module includes a lead frame, a power semiconductor device placed on a first surface of the lead frame, a cured material of a thermally conductive resin sheet provided on a second surface in an opposite side to the first surface of the lead frame on which the power semiconductor device is placed, and a heat sink member which comes into intimate contact with the cured material of a thermally conductive resin sheet. The thermally conductive resin sheet includes a thermosetting resin, and a thermally conductive and insulating inorganic filler. The inorganic filler is a mixed filler of a flat inorganic filler and a granular inorganic filler. A ratio of a volume content $V_L$ of the flat inorganic filler to a volume content $V_R$ of the granular inorganic filler in the mixed filler is from 30/70 to 80/20 in terms of $V_L/V_R$.

The thermally conductive resin sheet of the invention is a thermally conductive resin sheet including a thermosetting resin and a thermally conductive and insulating inorganic filler, wherein the inorganic filler is a mixed filler of a flat inorganic filler and a granular inorganic filler; and a ratio of a volume content $V_L$ of the flat inorganic filler to a volume content $V_R$ of the granular inorganic filler is from 30/70 to 80/20 in terms of $V_L/V_R$, and has insulation properties and markedly excellent thermal conductivity as compared with thermally conductive resin sheets using an inorganic flat filler or an inorganic granular filler singly.

The power module of the invention is a power module including a lead frame; a power semiconductor device placed on a first surface of this lead frame; a cured material of a thermally conductive resin sheet provided on a second surface in the opposite side to the surface of the lead frame on which the power semiconductor device is placed; and a heat sink member which comes into intimate contact with this cured material of a thermally conductive resin sheet, wherein the thermally conductive resin sheet is made of a thermosetting resin and the foregoing mixed filler. Since the power module of the invention is able to conduct heat generated in the power semiconductor device into the heat sink member in a high efficiency and to dissipate the heat, it is possible to realize miniaturization and enhancement in the capacity of the power module.

DETAILED DESCRIPTION OF THE INVENTION

Embodiment 1

Figure 1:
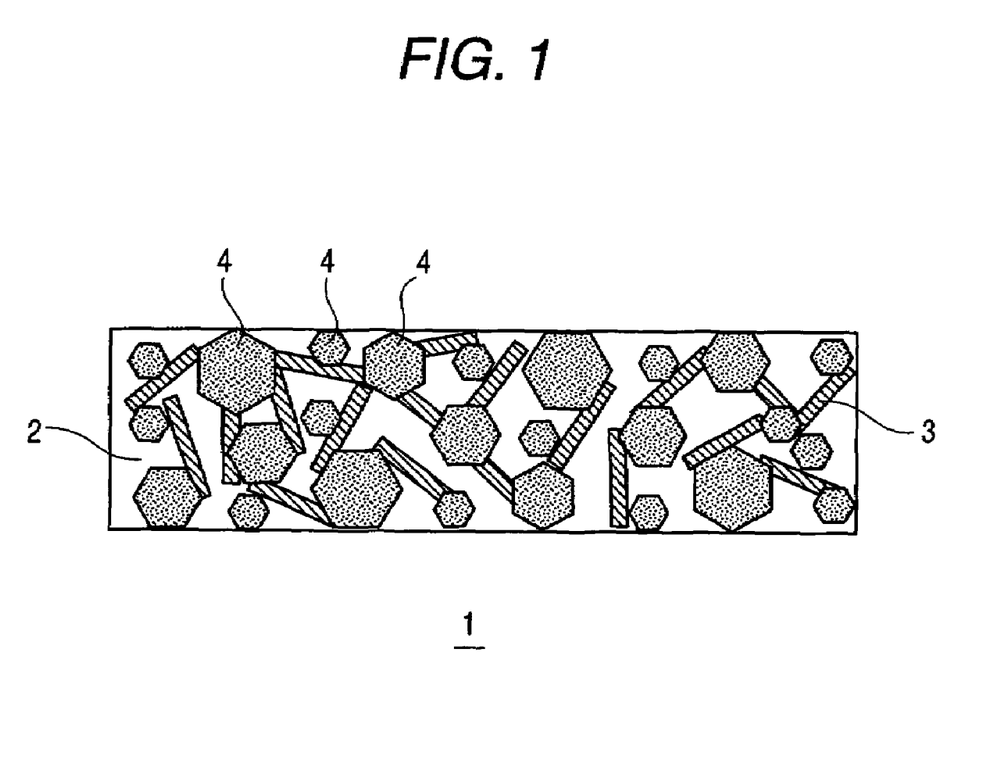
FIG. 1 is a cross-sectional schematic view of a thermally conductive resin sheet in Embodiment 1 of the invention.

FIG. 1 is a cross-sectional schematic view of a thermally conductive resin sheet in Embodiment 1 of the invention.

As shown in FIG. 1, a thermally conductive resin sheet 1 is constructed of a thermosetting resin 2 which becomes a matrix and an inorganic flat filler (hereafter abbreviated as "flat filler") 3 and an inorganic granular filler (hereinafter abbreviated as "granular filler") 4 which are dispersed in this thermosetting resin 2.

That is, the present inventors have found that when the filler which is contained in the thermally conductive resin sheet is a mixed filler consisting of the flat filler 3 and the granular filler 4 in a prescribed proportion, the thermal conductivity of the thermally conductive resin sheet is greatly improved as compared with the case where the filler is made of a flat filler or a granular filler singly, leading to accomplishment of the invention.

Figure 2A:
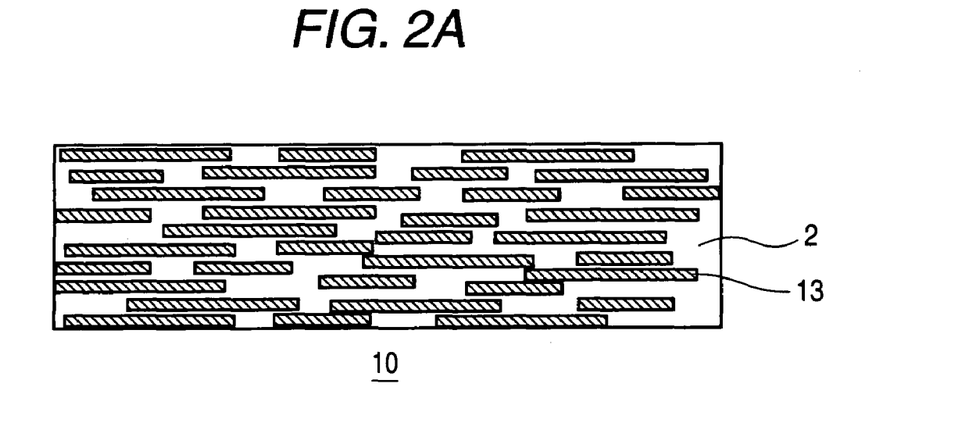
FIG. 2A is a cross-sectional schematic view showing a thermally conductive resin sheet containing a flat filler singly.
Figure 2B:
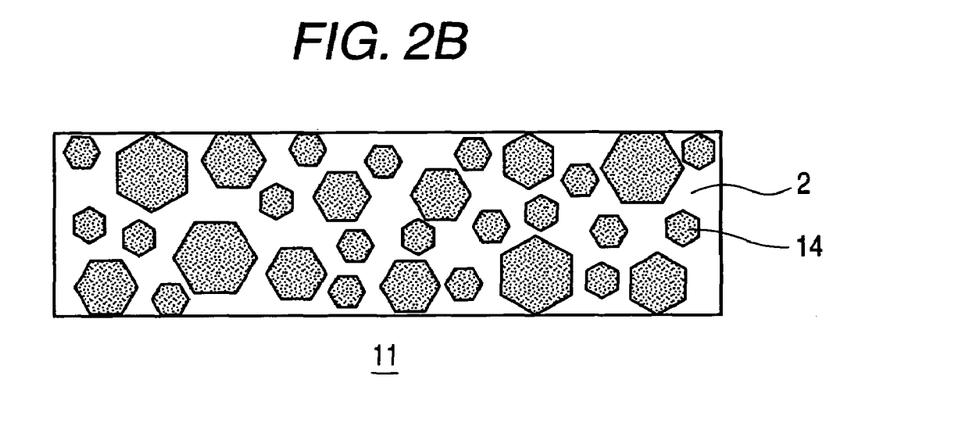
FIG. 2B is a cross-sectional schematic view showing a thermally conductive resin sheet containing a granular filler singly.

For the comparison, FIG. 2A is a view showing a thermally conductive resin sheet containing a flat filler singly; and FIG. 2B is a view showing a thermally conductive resin sheet containing a granular filler singly.

As shown in FIG. 2A, in a thermally conductive resin sheet 10 containing a flat filler 13 singly, a number of the flat fillers 13 are horizontally oriented within the plane of the thermally conductive resin sheet 10; and in the thickness direction of the thermally conductive resin sheet 10, many resin layers are mediated among the flat fillers 13, and a coefficient of thermal conductivity in the thickness direction of the thermally conductive resin sheet 10 is not high.

Furthermore, as shown in FIG. 2B, in a thermally conductive resin sheet 11 containing a granular filler 14 singly, the granular filler 14 is uniformly dispersed in the thermally conductive resin sheet 11; and many resin layers are mediated among the granular fillers 14, too, and a coefficient of thermal conductivity in the direction of the thermally conductive resin sheet 11 is not high.

The thermal conductivity of the thermally conductive resin sheet containing a mixed filler consisting of a flat filler and a granular filler in a prescribed proportion is greatly improved as compared with that in thermally conductive resin sheets containing either one filler singly, and the mechanism thereof is as follows.

First of all, in a thermally conductive resin sheet containing a mixed filler in which the proportion of the granular filler is higher than that of the flat filler, the flat filler is present among the granular fillers. This flat filler comes into contact with different granular fillers distributed in the thickness direction of the thermally conductive resin sheet and forms a passage in which the fillers lie in the thickness direction of the thermally conductive resin sheet and through which heat is conducted, whereby the thermal conductivity in the thickness direction of the thermally conductive resin sheet is improved.

Next, in a thermally conductive resin sheet containing a mixed filler in which the proportion of the flat filler is higher than that of the granular filler, the granular filler is present among the flat fillers, and the flat fillers which are oriented within the plane of the thermally conductive resin sheet is dispersed at an angle against the planar direction of the thermally conductive resin sheet. For that reason, the superposed flat fillers in a stratiform state form a passage in which the fillers lie against the thickness direction of the thermally conductive resin sheet and through which heat is conducted, whereby the thermal conductivity in the thickness direction of the thermally conductive resin sheet is improved. At this time, the granular filler comes into contact with both of the superposed flat fillers in a stratiform state and becomes a part of the passage in which the fillers lie against the thickness direction of the thermally conductive resin sheet and through which heat is conducted.

In a thermally conductive resin sheet containing a mixed filler having a blending ratio of the flat filler to the granular filler closed to 50/50, the thermal conductivity in the thickness direction of the thermally conductive resin sheet is improved due to the foregoing both mechanisms.

The "flat filler 3" as referred to herein is a tabular filler, and the shape of its outer periphery is not limited. However, a rectangular shape is preferable because its effect for improving the thermal conductivity in the thickness direction of the thermally conductive resin sheet 1 is especially high. Examples of the quality of the material for the flat filler 3 include aluminum oxide (alumina), boron nitride, and silicon carbide, all of which are electrically insulating. These materials may be used in admixture of two or more kinds thereof.

An average major axis size (hereinafter abbreviated as "$D_L$") of the flat filler 3 which is used in this embodiment is preferably from 0.5 μm to 100 μm. Especially, when it is from 1 to 50 μm, thixotropic properties of a thermally conductive resin composition which is prepared for the purpose of forming the thermally conductive resin sheet can be controlled, and therefore, such is more preferable.

Figure 3:
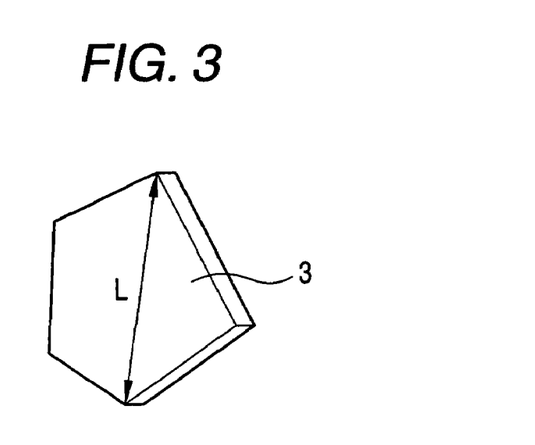
FIG. 3 is a view explaining the major axis size of a flat filler.

A "major axis size L" of the flat filler 3 as referred to in this embodiment is a longest length in the planar part of the flat filler 3 as shown in FIG. 3.

Though it is preferable that the granular filler 4 has a substantially spherical shape, it may have a polyhedral shape which is a pulverized shape. Examples of the quality of the material for the granular filler 4 include aluminum oxide (alumina), silicon oxide (silica), silicon nitride, aluminum nitride, silicon carbide, and boron nitride, all of which are electrically insulating. These materials may be used in admixture of two or more kinds thereof.

An average particle size (hereinafter abbreviated as "$D_R$") of the granular filler 4 which is used in this embodiment is from 0.4 to 3.6 times the $D_L$. When $D_R$ is less than 0.4 times the $D_L$, in the thermally conductive resin sheet 1, the amount of the flat fillers 3 which are dispersed at an angle against in the planar direction of the thermally conductive resin sheet 1 is low so that the improvement of the thermal conductivity in the thickness direction of the thermally conductive resin sheet 1 is small. On the other hand, when $D_R$ is more than 3.6 times the $D_L$, the effect of the flat filler 3 for connecting the granular fillers 4 to each other is reduced so that the improvement of the thermal conductivity in the thickness direction of the thermally conductive resin sheet 1 is small.

In this embodiment, a ratio of the flat filler 3 to the granular filler 4 in the mixed filler which is contained in the thermally conductive resin sheet 1 is preferably in the range of from 30/70 to 80/20 in terms of $V_L/V_R$, wherein $V_L$ represents a volume content of the flat filler in the mixed filler and $V_R$ represents a volume content of the granular filler in the mixed filler. The ratio ($V_L/V_R$) is more preferably in the range of from 34/66 to 70/30 because the effect for improving the thermal conductivity is especially large. When the ratio ($V_L/V_R$) is less than 30/70, the amount of the flat filler 3 which connects the granular fillers 4 to each other is low so that the effect for improving the thermal conductivity in the thickness direction of the thermally conductive resin sheet 1 is low. On the other hand, when the ratio ($V_L/V_R$) is more than 80/20, the amount of the flat fillers 3 which are dispersed at an angle against the horizontal direction to the plane of the thermally conductive resin sheet 1 is low so that the flat plane of the majority of the flat filler 3 becomes parallel to the plane of the thermally conductive resin sheet 1. For that reason, the amount of the passage of the filler from which heat is conducted in the thickness direction of the thermally conductive resin sheet 1 is low so that the effect for improving the thermal conductivity in the thickness direction of the thermally conductive resin sheet 1 is low.

As the thermosetting resin which becomes a matrix of the thermally conductive resin sheet 1, a composition of an epoxy resin, an unsaturated polyester resin, a phenol resin, a melamine resin, a silicone resin, a polyimide resin, etc. can be used. Of these, an epoxy resin composition is especially preferable because the production of the thermally conductive resin sheet 1 is easy.

Examples of a chief ingredient of the epoxy resin composition include a bisphenol A type epoxy resin, a bisphenol F type epoxy resin, an ortho-cresol novolak type epoxy resin, a phenol novolak type epoxy resin, an alicyclic aliphatic epoxy resin, and glycidyl aminophenol type epoxy resin. These epoxy resins may be used in admixture of two or more kinds thereof.

Examples of a curing agent of the epoxy resin composition include alicyclic acid anhydrides such as methyltetrahydrophthalic anhydride, methylhexahydrophthalic anhydride, and himic anhydride; fatty acid anhydrides such as dodecenylsuccinic anhydride; aromatic acid anhydrides such as phthalic anhydride and trimellitic anhydride; organic dihydrazides such as dicyandiamide and adipic acid dihydrazide; tris-(dimethylaminomethyl)phenol, dimethylbenzylamine, 1,8-diazabicyclo(5,4,0)undecane, and derivatives thereof; and imidazoles such as 2-methylimidazole, 2-ethyl-4-methylimidazole, and 2-phenylimidazole. These curing agents may be used in admixture of two or more kinds thereof.

If desired, a coupling agent may be contained in the thermally conductive resin sheet 1. Examples of the coupling agent which is used include γ-glycidoxypropyltrimethoxysilane, N-β-(aminoethyl)-γ-aminopropyltriethoxysilane, N-phenyl-γ-aminopropylmethoxysilane, and γ-mercaptopropyltrimethoxysilane. These coupling agents may be used in admixture of two or more kinds thereof.

When the coupling agent is contained in the thermally conductive resin sheet 1, the adhesive strength to heat generating parts or heat dissipating parts in electric or electronic appliances is improved.

Furthermore, in the case where an epoxy resin composition is used in the thermosetting resin which becomes a matrix of the thermally conductive resin sheet 1, when an epoxy resin having a number average molecular weight of 3,000 or more is used jointly as a part of the chief ingredient, flexibility of the thermally conductive resin sheet 1 is improved so that the adhesiveness to heat generating parts or heat dissipating parts in electric or electronic appliances is enhanced, and therefore, such is preferable. A blending proportion of the epoxy resin having a number average molecular weight of 3,000 or more is from 10 to 40 parts by weight based on 100 parts by weight of the liquid epoxy resin as the chief ingredient. When this blending proportion is less than 10 parts by weight, an improvement of the adhesiveness is not acknowledged. On the other hand, when this blending proportion is more than 40 parts by weight, heat resistance of a cured material of the thermally conductive resin sheet is lowered.

The thermally conductive resin sheet 1 of the invention is produced in the following method.

First of all, a thermosetting resin composition composed of a prescribed amount of a chief ingredient of a thermosetting resin and a curing agent in an amount necessary for curing this chief ingredient is mixed with, for example, a solvent of the same weight as in this thermosetting resin composition, to prepare a solution of the thermosetting resin composition. Next, a mixed filler consisting of a flat filler and a granular filler is added to and preliminarily mixed with the solution of the thermosetting resin composition. This preliminary mixture is kneaded by, for example, a three-roll mill or a kneader, to prepare a compound for thermally conductive resin sheet. Next, the resulting compound is coated on a mold release-treated resin sheet or metal plate by a doctor blade method. Next, this coated material is dried to volatilize off the solvent in the coated material, thereby obtaining the thermally conductive resin sheet 1. At this time, if desired, the coated material may be heated to promote the volatilization of the solvent. Alternatively, the reaction of the thermosetting resin composition may be advanced, thereby converting the thermally conductive resin sheet 1 into a B-stage.

Furthermore, in the case of a thermosetting resin composition having a low viscosity, the mixed filler may be added to the thermosetting resin composition itself without adding a solvent.

Furthermore, the additives such as a coupling agent may be added until the kneading step of the thermosetting resin composition and the mixed filler.

The thermally conductive resin sheet 1 of the invention can be, for example, used in the following manner.

In the thermally conductive resin sheet 1 as obtained in the foregoing method, since the thermosetting resin as the matrix is in a B-stage state, the thermosetting resin is interposed between a heat generating part and a heat dissipating member in an electric or electronic appliance is cured by heating, thereby not only bonding the heat generating part and the heat dissipating member to each other but also electrically insulating them. Since this cured material of the thermally conductive resin sheet has high thermal conductivity, heat from the heat generating part is efficiently conducted into the heat dissipating member.

Also, the thermally conductive resin sheet 1 is bonded to either one of the heat generating part or the heat dissipating member in an electric or electronic appliance, and the other is brought into press contact with the surface of the cured thermally conductive resin sheet, thereby conducting heat from the heat generating part into the heat dissipating member.

Also, the thermally conductive resin sheet 1 is cured, and the cured material of the thermally conductive resin sheet is interposed between the heat generating part and the heat dissipating member in an electric or electronic appliance, thereby conducting heat from the heat generating part into the heat dissipating member.

The thermally conductive resin sheet 1 of the invention contains a fixed filler consisting of an inorganic flat filler and an inorganic granular filler in the matrix of the thermosetting resin and has insulation properties and markedly excellent thermal conductivity as compared with those using an inorganic flat filler or an inorganic granular filler singly.

Furthermore, the thermally conductive resin sheet 1 as shown in this embodiment has a high coefficient of thermal conductivity even when the content of the filler is not increased to the limit. Thus, the viscosity of the compound for thermally conductive resin sheet can be decreased, and the thermally conductive resin sheet 1 having a thin thickness and a flat surface can be obtained.

That is, since the thickness can be made thin, there is brought such an effect that the thermal resistance in the thickness direction of the thermally conductive resin sheet 1 is low. Furthermore, since the surface of the resulting thermally conductive resin sheet 1 is flat, the adhesiveness to a heat generating part or a heat dissipating member is excellent, the contact thermal resistance is low, and the thermal conductivity is excellent.

Embodiment 2

Figure 4:
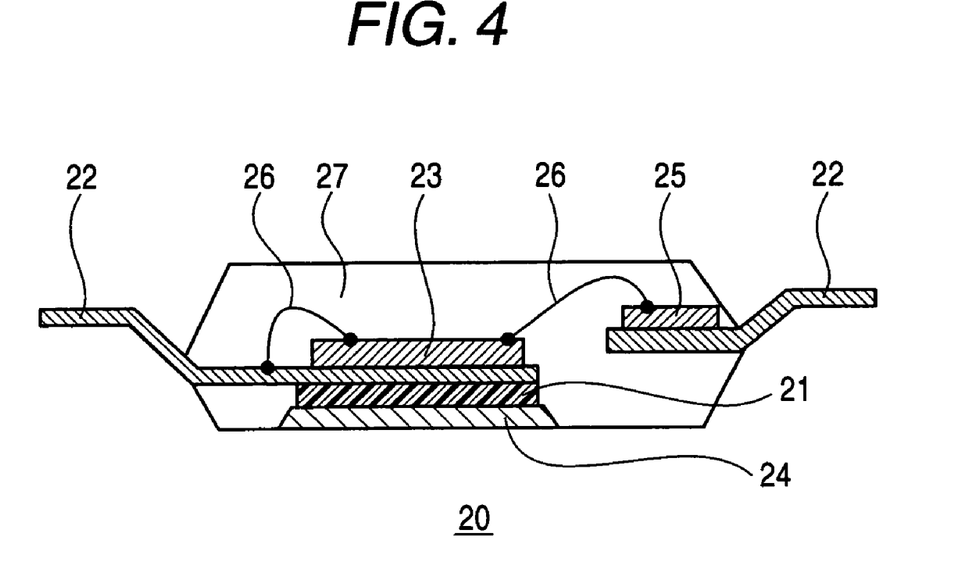
FIG. 4 is a cross-sectional schematic view of a power module in Embodiment 2 of the invention.

FIG. 4 is a cross-sectional schematic view of a power module in Embodiment 2 of the invention.

As shown in FIG. 4, in a power module 20 of this embodiment, a power semiconductor device 23 is placed on a first surface of a lead frame 22; and a heat sink member 24 is provided on a second surface in the opposite side to the surface of the lead frame 22 on which the power semiconductor device 23 is placed via a cured material 21 of the thermally conductive resin sheet 1 of Embodiment 1. The power semiconductor device 23 is connected to a control semiconductor device 25 which is also placed on the lead frame by a wire 26. The power module constructing members such as the thermally conductive resin sheet 21, the lead frame 22, the heat sink member 24, the power semiconductor device 23, the control semiconductor device 25, and the wire 26 are sealed by a molding resin 27. However, there is a structure in which a portion which is connected to an external circuit of the lead frame 22 and a surface of the heat sink member 24 in the opposite side to the surface onto which the thermally conductive resin sheet 21 is bonded are not covered by the molding resin 27.

The power module 20 of this embodiment is produced in the following manner. First of all, the power semiconductor device 23 and the control semiconductor device 25 are welded in a prescribed portion of the lead frame 22 by soldering or the like. Next, the heat sink member 24 is laminated on a second surface in the opposite side to the surface of the lead frame 22 on which the power semiconductor device 23 is placed via the thermally conductive resin sheet 1 in a B-stage state; and the thermally conductive resin sheet is cured by heating under pressure, thereby bonding the heat sink member 24. Next, the wire 26 is welded to the power semiconductor device 23 and the control semiconductor device 25 by a wire bonding method, thereby achieving wiring. Finally, for example, sealing with the molding resin 27 is carried out by, for example, a transfer molding method, thereby completing the power module 20.

In the power module 20 of this embodiment, the heat sink member 24 is bonded to the lead frame 22 on which the power semiconductor device 23 which is a heat generating part of the power module is placed via the cured material 21 of the thermally conductive resin sheet of Embodiment 1. The cured material 21 of the thermally conductive resin sheet of Embodiment 1 has not only electrical insulation properties but also excellent thermal conductivity which has not hitherto been seen and is able to conduct heat generated in the power semiconductor device 23 into the heat sink member 24 in a high efficiency and to dissipate the heat. Thus, it is possible to realize miniaturization and enhancement in the capacity of the power module.

The power module 20 of this embodiment has a structure in which the heat sink member 24 is bonded onto the surface of the cured material 21 of the thermally conductive resin sheet. Thus, as shown in a cross-sectional schematic view of FIG. 5, the power module 20 of this embodiment may have a structure in which the heat sink member 24 is embedded within the cured material 21 of the thermally conductive resin sheet.

Figure 5:
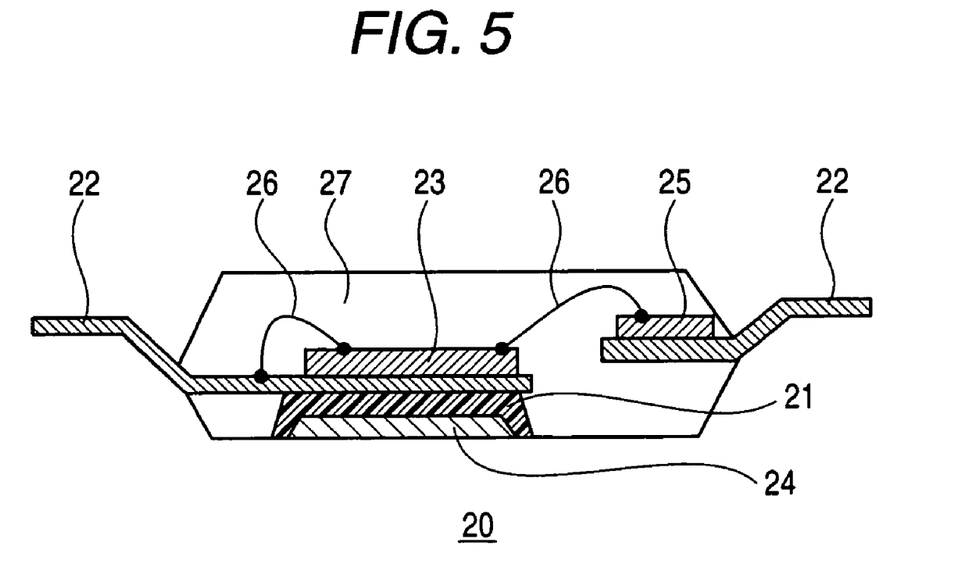
FIG. 5 is a cross-sectional schematic view of a power module having a structure in which a heat sink member is embedded within a cured material of a thermally conductive resin sheet.

By taking such a structure, in addition to the foregoing effects, fixing of the heat sink member 24 to the cured material 21 of the thermally conductive resin sheet becomes firm, and resistance to peeling of the heat sink member 24 caused due to a stress generated by heat cycle at the time of operation of the power module is improved.

Furthermore, irregularities of from 40 to 100 μm may be provided on the surface of the heat sink member. In this way, the adhesiveness to the thermally conductive resin sheet is improved.

Embodiment 3

Figure 6:
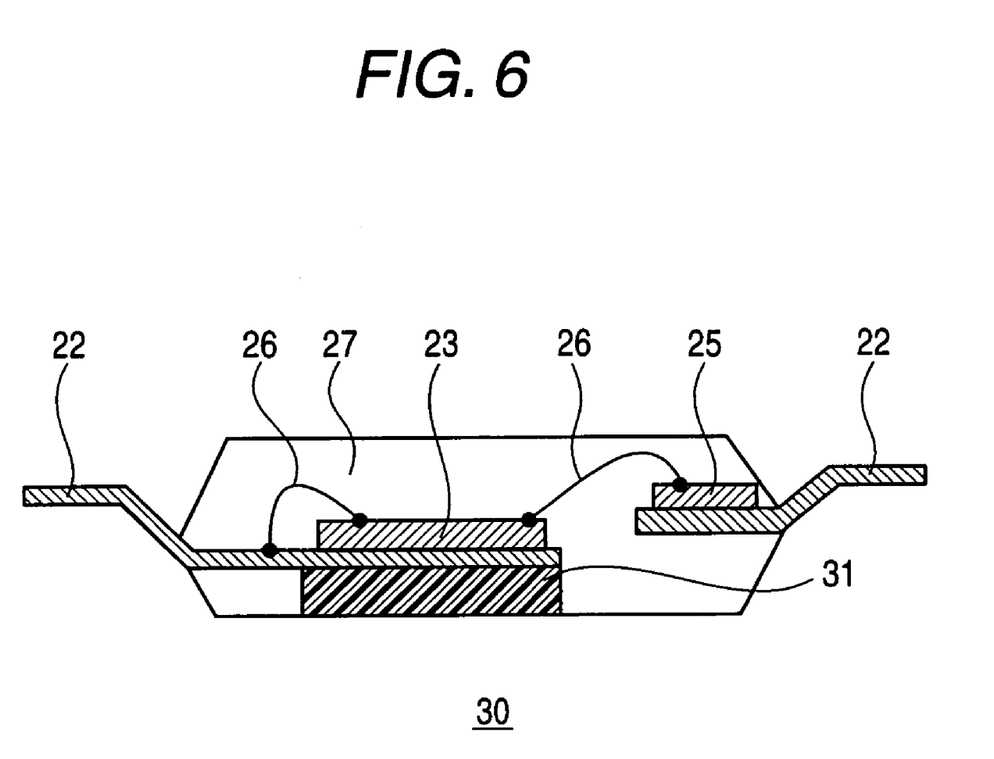
FIG. 6 is a cross-sectional schematic view of a power module in Embodiment 3 of the invention.

FIG. 6 is a cross-sectional schematic view of a power module in Embodiment 3 of the invention.

As shown in FIG. 6, a power module 30 of this embodiment is the same as the power module 20 of Embodiment 2, except that only the thermally conductive resin sheet 1 in a B-stage state is laminated on a second surface in the opposite side to the surface of the lead frame 22 on which the power semiconductor device 23 is placed and cured by heating to provide a cured material 31 of the thermally conductive resin sheet 1 and that a heat sink member made of a metal plate or an inorganic plate is no provided.

The power module 30 of this embodiment is able to make the number of parts small and to reduce the costs in addition to the foregoing effects which the power module 20 of Embodiment 2 possesses. In addition, the cured material 31 of the thermally conductive resin sheet 1 is able to make a difference in a coefficient of thermal expansion from the molding resin for sealing in comparison with the heat sink member made of a metal plate or an inorganic plate and to reduce a stress generated in the molding resin for sealing by heat cycle at the time of operation of the power module, whereby resistance to cracks of the power module is improved.

Embodiment 4

Figure 7:
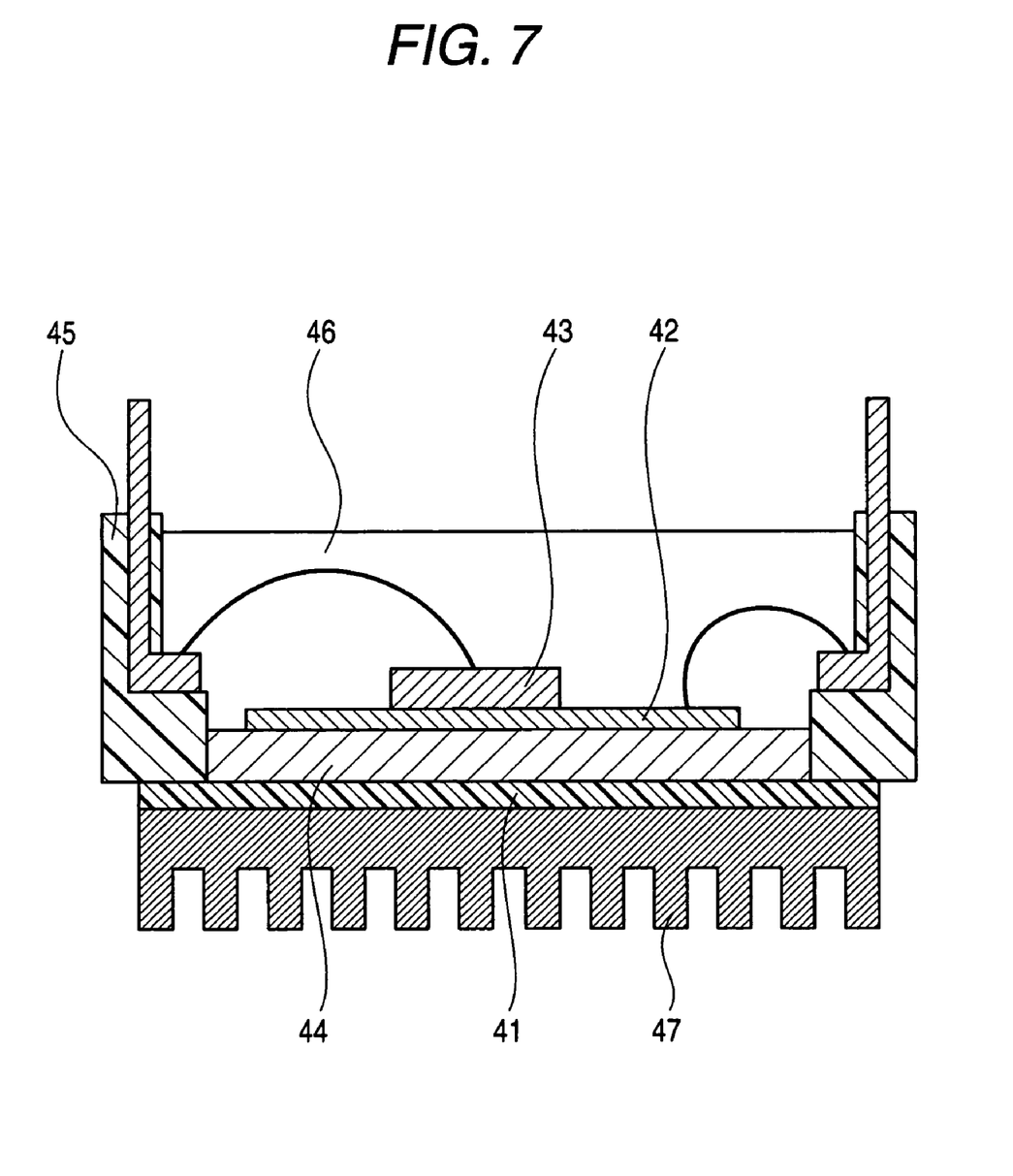
FIG. 7 is a cross-sectional schematic view of a power module in Embodiment 4 of the invention.

FIG. 7 is a cross-sectional schematic view of a power module in Embodiment 4 of the invention.

As shown in FIG. 7, a power module 40 of this embodiment is a power module of a case type. The power module 40 is composed of a heat sink member 44 made of an inorganic insulating plate; a circuit board 42 formed on the surface of the heat sink member 44; a power semiconductor device 43 which is placed on this circuit board 42; a case 45 bonded in the periphery of the heat sink member 44; a casting resin 46 for sealing the circuit board 42, the power semiconductor device 43 and so on, which is poured within this case; a cured material 41 of the thermally conductive resin sheet of Embodiment 1 laminated on a surface in the opposite side to the surface of the heat sink member 44 on which the circuit board 42 is provided; and a heat spreader 47 welded to the heat sink member 44 via the cured material 41 of the thermally conductive resin sheet.

In the power module 40 of this embodiment, the cure material 41 of the thermally conductive resin sheet 1 which welds the heat sink member 44 and the heat spreader 47 has excellent thermal conductivity which is not seen in conventional insulating thermally conductive resin sheets. Also, it is possible to realize miniaturization and enhancement in the capacity of the power module.

EXAMPLES

The thermally conductive resin sheet of the invention will be described below in more detail with reference to the following Examples.

Comparative Example 1

As Comparative Example 1, a thermally conductive resin sheet using a granular filler was prepared.

101 parts by weight of methyl ethyl ketone was added to a thermosetting resin composition consisting of 100 parts by weight of a liquid bisphenol A type epoxy resin (EPIKOTE 828, manufactured by Japan Epoxy Resins Co., Ltd.) as a chief ingredient and 1 part by weight of 1-cyanoethyl-2-methylimidazole (CUREZOL 2PN-CN, manufactured by Shikoku Chemicals Corporation) as a curing agent, and the mixture was stirred to prepare a solution of a thermosetting resin composition.

A granular silicon nitride filler having a $D_R$ of 5 µm (SN-7, manufactured by Denki Kagaku Kogyo Kabushiki Kaisha) having a volume the same as that of the foregoing thermosetting resin composition was added to and preliminarily mixed with the foregoing solution of the thermosetting resin composition. This preliminary mixture was kneaded in a three-roll mill, thereby obtaining a compound in which the foregoing filler was uniformly dispersed in the solution of the thermosetting resin composition.

Next, the foregoing compound was coated on the mold release-treated surface of a polyethylene terephthalate sheet having a thickness of 100 µm, one surface of which had been subjected to a mold release treatment, by a doctor blade method and dried by heating at 110° C. for 15 minutes, thereby preparing a thermally conductive resin sheet in a B-stage state having a thickness of 80 µm.

Next, this thermally conductive resin sheet was heated at 120° C. for one hour and then at 160° C. for 3 hours to form a cured material of the thermally conductive resin sheet, and a coefficient of thermal conductivity $K_R$ in the thickness direction of this cured material was measured by a laser flash method.

Comparative Example 2

As Comparative Example 2, a thermally conductive resin sheet using a flat filler was prepared. A thermally conductive resin sheet was prepared in the same manner as in Comparative Example 1, except for using a flat boron nitride filler having a $D_L$ of 7 µm (GP, manufactured by Denki Kagaku Kogyo Kabushiki Kaisha) as the filler. A coefficient of thermal conductivity $K_L$ in the thickness direction of a cured material of this thermally conductive resin sheet was measured by a laser flash method in the same manner as in Comparative Example 1.

Example 1

Samples 1 to 6 of respective thermally conductive resin sheets were prepared in the same manner as in Comparative Example 1, except for using a mixed filler resulting from mixing a flat boron nitride filler having a $D_L$ of 7 µm (GP, manufactured by Denki Kagaku Kogyo Kabushiki Kaisha) and a granular silicon nitride filler having a $D_R$ of 5 µm (SN-7, manufactured by Denki Kagaku Kogyo Kabushiki Kaisha) in a volume content ratio ($V_L/V_R$) as shown in Table 1 as the filler. Each of the samples was cured in the same manner as in Comparative Example 1, thereby obtaining a cured material of the thermally conductive resin sheet sample. A coefficient of thermal conductivity $K_M$ in the thickness direction of the respective cured material was measured by a laser flash method in the same manner as in Comparative Example 1.

A ratio of the coefficient of thermal conductivity $K_M$ of the cured material of each sample to the coefficient of thermal conductivity $K_R$ of the cured material of the thermally conductive resin sheet using the granular filler according to Comparative Example 1 ($K_M/K_R$); a ratio of the coefficient of thermal conductivity $K_M$ of the cured material of each sample to the coefficient of thermal conductivity $K_L$ of the cured material of the thermally conductive resin sheet using the flat filler according to Comparative Example 2 ($K_M/K_L$); a proportion of volume content between the flat filler and the granular filler in the mixed filler as used in each thermally conductive resin sheet sample ($V_L/V_R$); and a ratio of $D_R$ of the granular filler to $D_L$ of the flat filler ($D_R/D_L$) are shown in Table 1.

Figure 8:
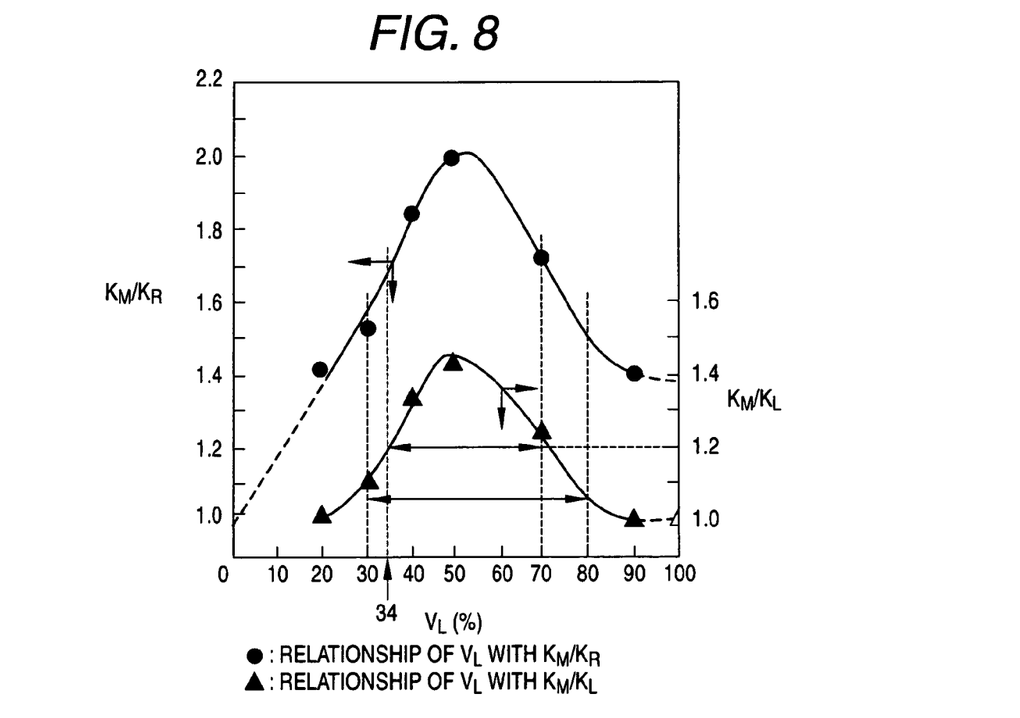
FIG. 8 is a drawing showing the relationship of a volume content $V_L$ of a flat filler in a mixed filler as used in each thermally conductive resin sheet sample with each of a ($K_M/K_R$) value and a ($K_M/K_L$) value of a cured material of each thermally conductive resin sheet sample.

From the results of the foregoing Example 1, the relationship of the volume content $V_L$ of the flat filler in the mixed filler as used in each thermally conductive resin sheet sample with each of the ($K_M/K_R$) value and the ($K_M/K_L$) value of the cured material of each of the prepared thermally conductive resin sheet samples is shown in FIG. 8.

As is clear from Table 1 and FIG. 8, the cured materials of the thermally conductive resin sheets having a $V_L$ in the range of from 30 to 80% have a large coefficient of thermal conductivity and have excellent thermal conductivity as compared with all of the thermally conductive resin sheet using a granular filler singly and the thermally conductive resin sheet using a flat filler singly. In particular, the coefficient of thermal conductivity of the cured materials of the thermally conductive resin sheets having a $V_L$ in the range of from 34 to 70% is 1.2 times or more the coefficient of thermal conductivity of the cured material of the thermally conductive resin sheet using a flat filler singly, and an effect for improving the thermal conductivity is especially large.

TABLE 1

|  |  | $D_R/D_L$ | $V_L/V_R$ | $K_M/K_R$ | $K_M/K_L$ |
|---|---|---|---|---|---|
| Example 1 | Sample 1 | 0.71 | 20/80 | 1.42 | 1.03 |
|  | Sample 2 | 0.71 | 30/70 | 1.53 | 1.11 |
|  | Sample 3 | 0.71 | 40/60 | 1.84 | 1.33 |
|  | Sample 4 | 0.71 | 50/50 | 1.98 | 1.43 |
|  | Sample 5 | 0.71 | 70/30 | 1.72 | 1.24 |
|  | Sample 6 | 0.71 | 90/10 | 1.40 | 1.01 |

Comparative Example 3

A thermally conductive resin sheet was prepared in the same manner as in Example 1, except for using a mixed filler resulting from mixing a flat boron nitride filler having a $D_L$ of 7 μm (GP, manufactured by Denki Kagaku Kogyo Kabushiki Kaisha) and a granular silicon carbide filler having a $D_R$ of 0.8 μm (GC#9000, manufactured by Fujimi Incorporated) in a volume content ratio ($V_L/V_R$) of 50/50 and having a $D_R/D_L$ ratio of 0.11. A coefficient of thermal conductivity $K_N$ in the thickness direction of a cured material of this thermally conductive resin sheet was measured by a laser flash method in the same manner as in Example 1.

The grade and $D_L$ of the flat boron nitride filler as used in the thermally conductive resin sheet and the kind, $D_R$ and $D_R/D_L$ of the granular silicon carbide filler are shown in Table 2.

Example 2

Samples 7 to 11 of respective thermally conductive resin sheets were prepared in the same manner as in Comparative Example 1, except for using a mixed filler resulting from mixing a flat boron nitride filler having a $D_L$ of 7 μm (GP, manufactured by Denki Kagaku Kogyo Kabushiki Kaisha) and a granular silicon nitride filler having a $D_R$ and the grade as shown in Table 2 in a volume content ratio ($V_L/V_R$) of 50/50. A coefficient of thermal conductivity $K_M$ in the thickness direction of a cured material of each sample was measured by a laser flash method in the same manner as in Comparative Example 1.

A ratio of the coefficient of thermal conductivity $K_M$ of the cured material of each sample and the coefficient of thermal conductivity $K_N$ of the cured material of the thermally conductive resin sheet of Comparative Example 3 ($K_M/K_N$); and the grade and $D_L$ of the flat boron nitride filler and the grade, $D_R$ and $D_R/D_L$ of the granular silicon carbide filler as used in each sample are shown in Table 2.

Figure 9:
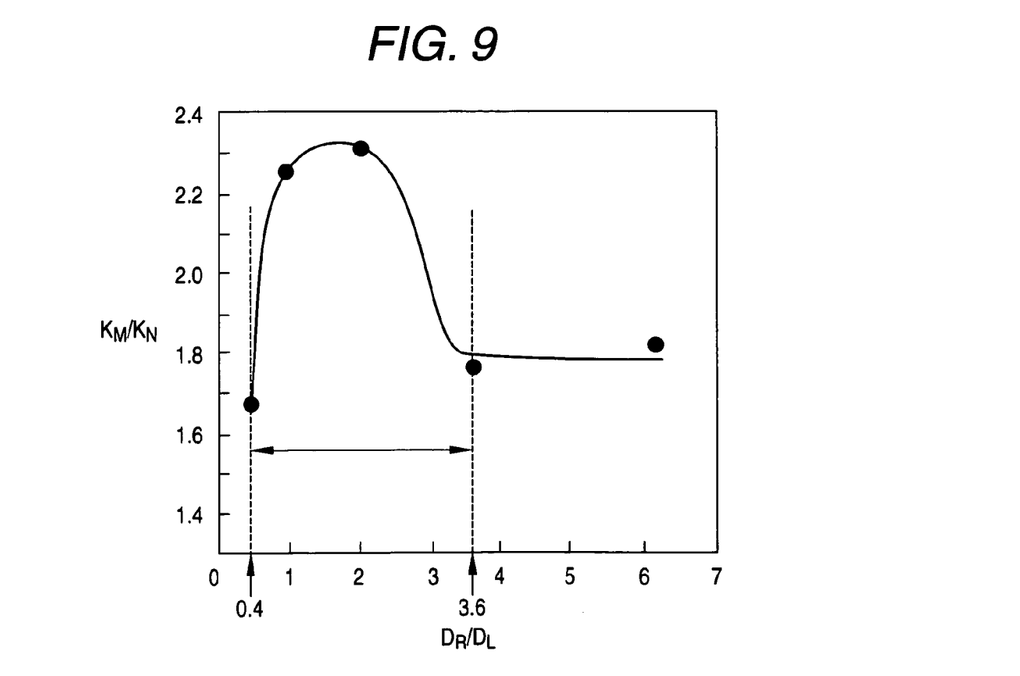
FIG. 9 is a drawing showing the relationship of a ($K_M/K_N$) value of a cured material of each thermally conductive resin sheet sample with a ratio of $D_R$ of a granular filler to $D_L$ Of a flat filler as used in a mixed filler ($D_R/D_L$) in each thermally conductive resin sheet sample.

From the results of the foregoing Example 2, the relationship of the ($K_M/K_R$) value of the cured material of each of the prepared thermally conductive resin sheet samples with a ratio of $D_R$ of the granular filler to $D_L$ of the flat filler as used in the mixed filler ($D_R/D_L$) in each of the thermally conductive resin sheet samples is shown in FIG. 9.

As shown in Table 2 and FIG. 9, when a mixed filler having a ratio ($D_R/D_L$) of $D_R$ of the granular filler to $D_L$ of the flat filler of from 0.4 to 3.6 is used, an effect for improving the thermal conductivity of the cured material of the thermally conductive resin sheet is especially large.

TABLE 2

| | | Flat boron nitride filler | | Granular silicon carbide filler | | | |
|---|---|---|---|---|---|---|---|
| | | Grade | $D_L$ (μm) | Grade | $D_R$ (μm) | $D_R/D_L$ | $K_M/K_N$ |
| Example 2 | Sample 7 | GP | 7 | GC#4000 | 3 | 0.43 | 1.67 |
| | Sample 8 | GP | 7 | GC#2000 | 7 | 1.0 | 2.25 |
| | Sample 9 | GP | 7 | GC#800 | 14 | 2.0 | 2.31 |
| | Sample 10 | GP | 7 | GC#500 | 25 | 3.6 | 1.76 |
| | Sample 11 | GP | 7 | GC#320 | 43 | 6.1 | 1.83 |
| Comparative Example 3 | | GP | 7 | GC#9000 | 0.8 | 0.11 | — |

Example 3

In Embodiment 2, the second surface of the lead frame 22 of the power module 20 and the heat sink member 24 made of copper were bonded to each other via the thermally conductive resin sheet 1 of any one of Samples 2 to 5 of Example 1. In addition, sealing with the molding resin 27 was carried out by a transfer molding method to complete the power module 20.

In this Example, a thermocouple was installed on the first surface of the lead frame 22 of the power module 20 and in the central part of the heat sink member 24 made of copper, and the power module 20 was worked with a full power, thereby measuring the temperature of each of the lead frame 22 and the heat sink member 24. All of the power modules 20 using the thermally conductive resin sheet 1 of any one of Samples 2 to 5 are small in a temperature difference between the lead frame 22 and the heat sink member 24 as 5° C. and are excellent in the heat dissipation properties. Thus, in the power modules of this Example, it is possible to realize miniaturization and enhancement in the capacity of the power module.

What is claimed is:

1. A thermally conductive resin sheet comprising:
a substantially planar sheet of a thermosetting resin; and
a thermally conductive and electrically insulating inorganic filler, wherein
the inorganic filler is a mixture of a flat inorganic filler and a granular inorganic filler,
ratio of volume content, $V_L$, of the flat inorganic filler to volume content, $V_R$, of the granular inorganic filler in the mixture is from 30/70 to 80/20, in terms of $V_L/V_R$,
average particle size, $D_R$, of the granular inorganic filler is from 1 to 6.1 times average major axis size, $D_L$, of the flat inorganic filler, and
the flat inorganic filler is dispersed within the substantially planar sheet of thermo-setting resin oblique to the plane of the substantially planar sheet of thermo-setting resin.

2. The thermally conductive resin sheet according to claim 1, wherein the thermosetting resin is an epoxy resin composition containing, as a principle ingredient, a mixture of a liquid epoxy resin and an epoxy resin having a number average molecular weight of at least 3,000.

3. A power module comprising:
a lead frame;
a power semiconductor device on a first surface of the lead frame;
a cured material of a thermally conductive resin sheet on a second surface, opposite the first surface of the lead frame on which the power semiconductor device is located; and
a heat sink member in intimate contact with the cured material, wherein
the thermally conductive resin sheet includes a substantially planar sheet of a thermosetting resins and a thermally conductive and electrically insulating inorganic filler,
the inorganic filler is a mixture of a flat inorganic filler and a granular inorganic filler,
ratio of volume content, $V_L$, of the flat inorganic filler to volume contents $V_R$, of the granular inorganic filler in the mixture is from 30/70 to 80/20, in terms of $V_L/V_R$.
average particle size, $D_R$, of the granular inorganic filler is from 1 to 6.1 times average major axis size, $D_L$, of the flat inorganic filler, and the flat inorganic filler is dispersed within the substantially planar sheet of thermo-setting resin oblique to the plane of the substantially planar sheet of thermo-setting resin.

4. The power module according to claim 3, wherein the heat sink member is embedded within the cured material of the thermally conductive resin sheet and only a heat dissipating surface of the heat sink member is exposed.

5. A power module comprising:
a lead frame;
a power semiconductor device on a first surface of the lead frame; and
a cured material of a thermally conductive resin sheet, as a heat sink member, on a second surface, opposite to the first surface of the lead frame on which the power semiconductor device is located, wherein
the thermally conductive resin sheet includes a substantially planar sheet of a thermosetting resin and a thermally conductive and electrically insulating inorganic filler,
the inorganic filler is a mixture of a flat inorganic filler and a granular inorganic filler,
ratio of volume content, $V_L$, of the flat inorganic filler to volume contents, $V_R$, of the granular inorganic filler in the mixture is from 30/70 to 80/20, in terms of $V_L/V_R$,
average particle size, $D_R$, of the granular inorganic filler is from 1 to 6.1 times average major axis size, $D_L$, of the flat inorganic filler, and
the flat inorganic filler is dispersed within the substantially planar sheet of thermo-setting resin oblique to the plane of the substantially planar sheet of thermo-setting resin.

6. A power module comprising:
a heat sink member;
a circuit board on a surface of the heat sink member;
a power semiconductor device on the circuit board;
a case bonded to a periphery of the heat sink member;
a casting resin within the case, sealing the circuit board and the power semiconductor device;
a cured material of a thermally conductive resin sheet laminated on a surface, opposite the surface of the heat sink member on which the circuit board is located; and
a heat spreader joined to the heat sink member via the cured material of the thermally conductive resin sheet, wherein
the thermally conductive resin sheet includes a substantially planar sheet of a thermosetting resin and a thermally conductive and electrically insulating inorganic filler,
the inorganic filler is a mixture of a flat inorganic filler and a granular inorganic filler,
ratio of volume content, $V_L$, of the flat inorganic filler to volume contents $V^R$, of the granular inorganic filler in the mixture is from 30/70 to 80/20, in terms of $V_L/V_R$.
average particle size, $D_R$, of the granular inorganic filler is from 1 to 6.1 times average major axis size, $D_L$, of the flat inorganic filler, and
the flat inorganic filler is dispersed within the substantially planar sheet of thermo-setting resin oblique to the plane of the substantially planar sheet of thermo-setting resin.

* * * * *